United States Patent [19]
Burns

[11] Patent Number: 4,796,996
[45] Date of Patent: Jan. 10, 1989

[54] LASER TEMPERATURE MODULATION AND DETECTION METHOD

[75] Inventor: Matthew J. Burns, Philadelphia, Pa.

[73] Assignee: American Telephone and Telegraph Company, AT&T Bell Laboratories, Murray Hill, N.J.

[21] Appl. No.: 85,448

[22] Filed: Aug. 14, 1987

[51] Int. Cl.⁴ .............................................. G01B 11/00
[52] U.S. Cl. ...................................... 356/372; 372/29
[58] Field of Search .................... 356/1, 4, 372; 372/29

[56] References Cited

U.S. PATENT DOCUMENTS

| | | | |
|---|---|---|---|
| 2,982,856 | 5/1961 | Camp | 250/352 |
| 4,369,525 | 1/1983 | Breton et al. | 372/29 |
| 4,373,805 | 2/1983 | Mallinson | 356/1 |
| 4,399,566 | 8/1983 | Roullet et al. | 455/611 |
| 4,677,632 | 1/1987 | Cisco et al. | 372/29 |

FOREIGN PATENT DOCUMENTS 0073985  6/1978  Japan ..................................... 372/29

Primary Examiner—Richard A. Rosenberger
Assistant Examiner—Crystal Cooper
Attorney, Agent, or Firm—W. W. Koba; Richard D. Laumann

[57] ABSTRACT

Periodically modulating the temperature of a semiconductor laser while maintaining constant optical power permits very precise measurements of the operating parameters of the laser.

6 Claims, 1 Drawing Sheet

LASER TEMPERATURE MODULATION AND DETECTION METHOD

TECHNICAL FIELD

This invention relates to mehods which detect electrical or optical changes in semiconductor lasers and external cavity lasers.

BACKGROUND OF THE INVENTION

There are numerous applications in which it is desirable to detect small changes, either electrical or optical, in the operating parameters of semiconductor lasers. Measurements of these parameters, as well as perhaps other parameters, are typically carried out with the laser operating at both fixed temperature and output power using direct detection of the laser output. Fixed power is typically maintained with automatic power control (APC).

Fixed temperature and power operation is also used with the light source in an optical time domain reflectometer which determines the distance from the light source to, for example, a reflecting surface in an optical fiber by measuring the elapsed time between pulse emission and return. In this application, changes in the operating parameters are not measured.

An important application of operating parameter measurements is the determination of semiconductor laser reliability or lifetime. While lifetime measurements are important for virtually all laser applications, they are especially important for optical communications applications, such as submarine cables, where laser replacement is both difficult and expensive.

Lifetime measurements typically rely on a technique, called accelerated aging, which operates a semiconductor laser for a prolonged period of time at a temperature elevated with respect to the normal operating temperature. Changes in the electrical input power of the laser are detected as constant optical output power is maintained. While perfectly adequate for many purposes, this technique suffers from the drawback that the degradation mechanism operative at the elevated temperature need not be the degradation mechanism operative at the intended use temperature. There is, therefore, an element of uncertainty in the lifetime results obtained.

The measurement of semiconductor laser parameters is made still more difficult by the discovery that nonlinear optical cavity effects produce instabilities in the laser APC system. Thus, the accuracy of the parameter measurements is limited by the control system's stability. The control system has equilibrium points which are the solutions to the closed loop control system. An equilibrium point is considered stable if the system ultimately approaches that point. The concept of stability thus means, in practical terms, the behavior of the control system in the neighborhood of an equilibrium point. However, if the entire system has a single nonlinear element, there may be regions in which there is no equilibrium point. It should also be noted that some lasers may fluctuate between multiple equilibrium points and reduce the signal to noise ratio. For example, there may be discontinuities in the light output versus current characteristic curve. This condition is made worse when, as inevitably happens, a small perturbation disturbs the system equilibrium and causes a temporal discontinuity in the parameter measurement. Thus, the precision of the measurements is also limited by one's ability to distinguish between instabilities in the device under test and the control system. Uncertainties in the parameter measurements and the projected lifetimes inevitably result.

SUMMARY OF THE INVENTION

It has been found that small electrical and optical changes in semiconductor lasers may be detected with a modulation technique which periodically varies the wavelength of the output radiation by varying an operating parameter, such as the temperature, of the laser while maintaining constant optical output from a first laser face, thereby producing a change in, for example, the output wavelength and threshold current of the laser. The constant optical power is maintained by, for example, automatic power control. The output from the first or second laser face may encounter an optical cavity in the optical circuit. A periodic temperature modulation introduces amplitude and phase modulation into the semiconductor laser output resulting from such an optical cavity. A low pass filter rejects the phase modulation and the remaining amplitude modulation signal is used to recover the relevant signal, that is, the signal indicating changes in either or both the electrical or optical characteristics of the laser. The method may be used for operating temperature determinations of laser lifetimes and for precise determinations of external optical cavity dimensions, that is, distances from a laser output face to reflecting surfaces.

DETAILED DESCRIPTION

Figure 1:
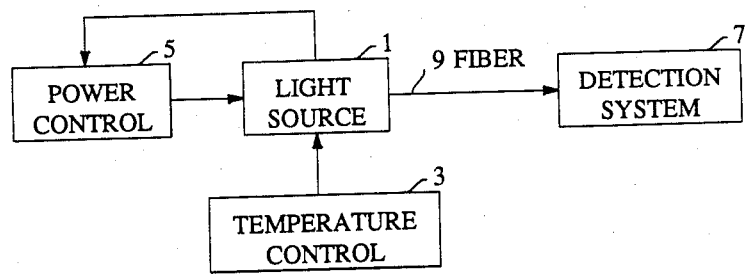
FIG. 1 is a block diagram illustrating apparatus suitable for the practice of the method of this invention.

FIG. 1 is a schematic representation in the form of a block diagram of apparatus suitable for the practice of this invention. The apparatus comprises light source 1, temperature control unit 3, power control unit 5 and detection system 7 which is optically coupled to the light source by means of, for example, optical fiber 9. As is evident, there is a feedback loop between the power control unit and the light source. The power control unit has means for monitoring the light output from a first face of the laser and adjusting the current delivered to the laser to maintain the light output from the first face at a constant level. Automatic power control (APC) will maintain the optical output power constant. APC is well known to those skilled in the art and need not be described in more detail.

The light source is typically a semiconductor laser although other types of lasers may be used if desired. The laser need not be a single longitudinal mode laser, that is, a single frequency laser, as the highest power mode will make the dominant contribution to the detected amplitude if a multilongitudinal mode laser is used. More precisely, the method of this invention will work with a multiple longitudinal mode output laser as the method relies on the motion of the centroid of the lines rather than the motion of individual lines.

The temperature control unit is also well known to those skilled in the art and may comprise, for example, a thermoelectric unit which periodically varies the temperature of the laser. Further description is not required. The selection of a suitable period, as well as amplitude, will be discussed later.

The temperature control unit is used to produce changes in the amplitude of the light from the cavity by producing changes in the wavelength of the light from the laser. It is possible to vary other parameters, such as current, which also produce variations in the wavelength of the light. The latter parameter produces smaller variations in the wavelength than does the former parameter. Of course, in this embodiment, the temperature control unit becomes a current control unit.

The detection system includes a photodetector and electronics to do the necessary processing of the electrical signal generated by photons being absorbed in the photodetector. The signal processing will be described later. Details of the system will be readily known to those skilled in the art.

Any well known optical fiber or other type of waveguide may be used to optically connect either face of the source to a detection system. In all embodiments, the source, the detection system and the APC system are coupled through optical circuits that may include an optical cavity which may be formed in, for example, free space. Free space is a desirable cavity medium because the cavity is easily formed in the free space between the laser and the optical fiber. Additionally, the distance from the light source to any reflecting surface within the laser package may form a cavity. The method of this invention can be used to accurately measure the distance from the light source to such a reflecting surface assuming the proper conditions are satisfied.

Figure 2:
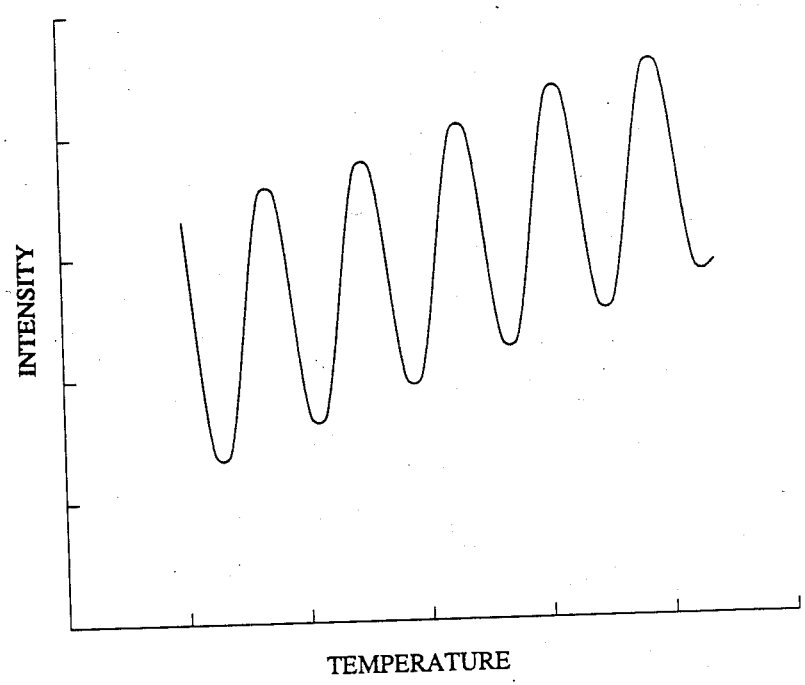
FIG. 2 plots laser output from the optical cavity vertically in arbitrary units versus the temperature of the laser horizontally in arbitrary units.

FIG. 2 shows the light output from the cavity plotted vertically in arbitrary units versus the laser temperature horizontally, also in arbitrary units.

The range of temperature modulation is determined by the change of wavelength with temperature and the magnitude of the temperature change that is easily obtained. Of course, the temperature should change by an amount sufficient to change the wavelength by an amount sufficient to produce a significant change in the intensity of the radiation from the cavity. The rate of temperature change is limited by practical considerations such as the need to obtain data in a reasonable amount of time and the desire to avoid extraneous effects that might arise if portions of the laser package were at different temperatures.

The power control unit (APC) is an automatic system which uses a photodetector to measure the light output from the first, i.e., back, face of the laser to start the feedback loop. An error signal is derived at the input of the power amplifier, which drives the laser, by comparing the laser output power, as measured by the photodetector, to a reference signal. The control system then adjusts the laser bias current, generated by the amplifier, to minimize the error signal. The desired operating point is established when the minimum error signal is obtained.

The controllability of the nonlinear system is improved by the introduction of the small carrier modulation. This is accomplished according to the present invention by periodically varying the laser operating wavelength by varying, for example, the laser temperature around a nominal temperature. This modulation technique has the advantage of not only varying the laser wavelength but also modulating both the threshold current and, in some embodiments, the fiber-laser alignment or the physical geometry of other optical cavities. A variation of typically only several degrees C. is sufficient to enable such parameters as the threshold current, optical wavelength, and laser-fiber alignment, if present, to be usefully studied. The wavelength of the emitted radiation depends upon other parameters, such as current, which could be periodically varied with the temperature remaining constant.

The signal which must be ultimately recovered is the variation in the operating parameter of the laser package being studied. For long term lifetime studies, the detection system must be sensitive to the long term, gradual degradation of these operating parameters. The desired signal may be recovered by using a low pass filter at the modulation frequency to eliminate harmonic components produced by phase modulation. This method essentially recovers the baseband portion of the modulated output signal. The carrier signal is then removed by linear superposition using the temperature signal as a local oscillator. This effectively provides notch filtering cation around the carrier frequency. Of course, the phase of the local oscillator and modulated signal must remain synchronized for the superposition to be effective. Because the filter has a phase delay at the carrier frequency, the local oscillator signal is processed by an indentical filter to maintain phase synchronization.

The signal is desirably processed with digital signal processing techniques. A recursive filter may be constructed which will replicate, e.g., Butterworth, Chebyshev, Elliptic or Bessel characteristics. Details will be readily apparent to those skilled in the art and need not be discussed in further detail. The desired amplitude response can be readily achieved.

The continuous time signals are converted to a digital time series by sampling. The ideal sampling function consists of an infinite series of equally spaced impulses or Dirac delta functions. The output of the sampler is thus a time series of equi-distant pulses with amplitudes equal to the value of the function being sampled at that time. Distortion is avoided if the original signal is band limited in the sampling interval is chosen to be at least twice the band limited frequency. This is the Nyquist criteria and specifies the minimum sampling rate.

In addition to lifetime studies, the method of this invention is also useful in measuring small distances as will be explained by the following example.

The resonance for a cavity of length d coupled to an optical source of wavelength $\lambda$ is given by $$d = \lambda(\lambda + \Delta\lambda)/2\Delta\lambda. \tag{1}$$

If it is now assumed that $\Delta\lambda$ is much less than the wavelength $\lambda$, equation (1) simplifies to $$d = \lambda^2/2\Delta\lambda. \tag{2}$$

Now if it is assumed that $\Delta\lambda$ may be approximated by $\Delta\lambda = (\delta\lambda/\delta T)\tau$ where $\delta\lambda/\delta T$ is the temperature-wavelength coefficient of the laser source, $\tau$ is the degrees C. per cycle between amplitude maxima. The cavity length may then be represented by $$d = (\lambda^2/2\tau)\delta T/\delta\lambda \tag{3}$$

For a laser emitting at a wavelength of 1.3 microns, $\delta\lambda/\tau T$ is typically approximately 0.75 angstroms per degree C. and the wavelength is 13,000 angstroms. Thus, in centimeters, $d = 1.127/\tau$. If $\tau$ is 0.1 degrees C., d will be approximately 11 centimeters while if $\tau$ is approximately 10 degrees C., d will be approximately 0.1 centimeter. Thus, measurement of the space between amplitude maxima permits determination of these distances or changes in distance with accuracy. A similar analysis will be readily done by those skilled in the art for other embodiments such as using a periodic current variation to vary the wavelength of the emitted light.

Thus, choice of other lasers with different characteristics or use of other modulation schemes will permit the method to measure either larger or smaller distances accurately.

Another application of temperature modulation examines the Fabry-Perot reflections of individual laser packages to determine their suitability for high speed, near 0.5 Gbit/sec or even greater, optical transmission systems. Optical feedback to the laser may produce intensity variations that result in a power penalty at the receiver. The Fabry-Perot reflections degrade system performance, and those packages with large amplitude variations, induced by reflections, may be identified. Thus, a static measurement is useful in characterizing dynamic performance characteristics.

Small mechanical displacements may be measured by forming a Fabry-Perot etalon or interferometer cavity at, for example, the end of a fiber. Scanning wavelength by temperature modulation produces intensity variations. However, if the cavity dimensions change due to pressure, vibrations, etc., the amplitude maxima shift to new positions when the bias current is plotted versus temperature. In this case, APC is used, but the change in bias current with temperature is measured.

The following considerations assist in understanding this application. The laser is operated with temperature modulations using APC. Amplitude variations in control current are measured. It can be shown that these amplitude variations are given reasonably accurately by Airy's formula:

$$\frac{i}{i_{max}} = \frac{1}{1 + F_{sin}^2 (\delta/2)}$$

where i and $i_{max}$ are the detected and maximum photocurrent, respectively; $F=4R/(1-R)^2$ where R is the reflectance; and $\delta=4\pi nd \cos\theta/\lambda$ where n is the refractive index, d is the spacing, $\theta$ is the angle of incidence and $\lambda$ is the wavelength. For a hypothetical, but realistic situation in which R is approximately 1 percent, $i/i_{max}$ will be approximately 4 percent, an easily detected change.

What is claimed is:

1. A method of measuring a parameter of a system comprising a semiconductor laser comprising the steps of:
    periodically cycling the emission wavelength of said semiconductor laser;
    monitoring the optical power from a first face of said laser;
    using a feedback control system to maintain said optical power from said first face at a constant level;
    emitting light from said laser into an optical cavity which is optically coupled to one face of said semiconductor laser; and
    measuring a characteristic of said system.

2. A method as recited in claim 1 in which said cycling periodically varies the temperature of said laser.

3. A method as recited in claim 2 in which said measuring comprises detecting the optical signal intensity from said optical cavity.

4. A method as recited in claim 1 in which said measuring is of bias current through said laser.

5. A method as recited in claim 1 in which said measuring step further comprises measuring the distance between intensity maxima thereby determining cavity dimensions.

6. A method as recited in claim 1 in which said cycling varies bias current through said laser.

* * * * *